United States Patent
Suzuki et al.

(10) Patent No.: US 6,844,283 B2
(45) Date of Patent: Jan. 18, 2005

(54) ZERO THERMAL EXPANSION MATERIAL AND PRACTICAL COMPONENT PARTS MAKING USE OF THE SAME

(75) Inventors: Tomoko Suzuki, Kawasaki (JP); Atsushi Omote, Sagamihara (JP); Jun Kuwata, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/837,718

(22) Filed: May 4, 2004

(65) Prior Publication Data

US 2004/0204307 A1 Oct. 14, 2004

Related U.S. Application Data

(62) Division of application No. 10/189,773, filed on Jul. 8, 2002.

(30) Foreign Application Priority Data

Jul. 12, 2001 (JP) .......................................... 2001-211826
May 24, 2002 (JP) .......................................... 2002-150338

(51) Int. Cl.$^7$ ....................... C04B 35/495; C04B 35/486
(52) U.S. Cl. ....................... 501/134; 501/102; 501/104; 423/594.12; 423/594.13
(58) Field of Search ......................... 501/134, 102–104; 423/594.12, 594.13

(56) References Cited

U.S. PATENT DOCUMENTS

| | | | |
|---|---|---|---|
| 5,322,559 A | | 6/1994 | Sleight |
| 5,433,778 A | | 7/1995 | Sleight |
| 5,514,360 A | * | 5/1996 | Sleight et al. .......... 423/594.12 |
| 5,694,503 A | | 12/1997 | Fleming et al. |
| 6,187,700 B1 | * | 2/2001 | Merkel ........................ 501/32 |
| 6,377,729 B2 | | 4/2002 | Merkel |
| 6,403,511 B2 | | 6/2002 | Fleming et al. |

OTHER PUBLICATIONS

Chemi. Matter. 1995, 7, 412–417.
Chemi. Matter. 1996, 8, 2809–2823.
Physica B 241–243 (1998) 311–316.
Journal of Solid State Chemistry 149 (2000) 92–98.

* cited by examiner

*Primary Examiner*—Karl Group
(74) *Attorney, Agent, or Firm*—Louis Woo

(57) ABSTRACT

Using as a negative thermal expansion material a double oxide containing at least partly a compound represented by the chemical formula: RQ,O, (wherein R is Zr, Hf or a tetravalent metallic element represented by a mixture system of these, and Q is a hexavalent metallic element selected from W and Mo), and using as a positive thermal expansion material a material containing at least partly a compound represented by the chemical formula: MQX, (wherein M is Mg, Ca, Sr, Ba, Ra or a divalent metallic element represented by a mixture system of any of these, Q is a hexavalent metallic element selected from W and Mo, and X is an element selected from O and S), these are mixed preferably in a weight ratio of 1:1 and are synthesized to obtain a material whose coefficient of thermal expansion is substantially zero over a wide temperature range, i.e., a zero thermal expansion material. Using this zero thermal expansion material, high-precision and high-performance practical component parts can be obtained.

4 Claims, 4 Drawing Sheets

ZERO THERMAL EXPANSION MATERIAL AND PRACTICAL COMPONENT PARTS MAKING USE OF THE SAME

This application is a divisional of U.S. patent application 10/189,773, filed Jul. 8, 2002.

BACKGROUND OF THE INVENTION

1. Field of the Invention

This invention relates to a zero thermal expansion material and a practical component part making use of the same, which are used in electronic materials, precision machine component parts, structural materials and so forth of products making use of high frequencies.

2. Description of the Prior Art

Electronic materials and structural materials have conventionally been produced using oxides and resins or using glass and metals. For example, substrates for high-frequency circuits have been produced using dielectrics or resins which have been made into sheets or plates. Such conventional electronic materials and structural materials usually have positive coefficients of thermal expansion. Hence, these materials have properties of causing expansion and contraction in accordance with rise and drop of ambient temperature.

Meanwhile, in recent years, materials whose coefficients of thermal expansion are negative in some crystal systems are reported. For example, in Chemi. Mater., 1995, 7, 412–417, K. Korthuis et al. reports $ZrV_2O_7$. InChemi. Mater., 8,1996,2809–2823, J. S. O. Evans et al. reports $ZrW_2O$ and $HfW_2O_8$. In Pysica B 241–243(1998)311–316, the same J. S. O. Evans et al. reports materials having the general formula: $A_2(MO_4)_3$ (A is Al, Y or a lanthanum group element), in particular, materials wherein A is Sc. In Journal of Solid-State chemistry, 149, 92–98 (2000), D. A. Woodcock et al. also reports materials having the general formula: $A_2(MO_4)_3$) (A is Al, Y or a lanthanum group element), in particular, materials wherein A is Y or Al.

Of these, Evans et al. asserts negative thermal expansion theory that, in materials having negative coefficients of thermal expansion, the whole bonding distance contracts because rotary motion increases with a rise in temperature, in an M-O-M (M is a metallic element) bond.

As these reports have been made, it has been studied to materialize a material having a low absolute value of coefficient of thermal expansion (a low thermal expansion material), using a mixture of a material having a positive coefficient of thermal expansion and the material having a negative coefficient of thermal expansion as in the foregoing. For example, Sleight et al.'s U.S. Pat. Nos. 5,322,559 and 5,433,778 disclose low thermal expansion materials comprised of a composite material of the above negative thermal expansion material and an epoxy resin.

However, it has not been reported that a method of producing such a material is applied to ceramic materials used widely in, e.g., high-frequency circuit component parts and the negative thermal expansion material and a ceramic material are simultaneously fired to produce a new low thermal expansion material.

Thus, conventional electronic materials or component parts and structural materials, which have positive coefficients of thermal expansion, inevitably cause expansion and contraction in accordance with changes in ambient temperature. Even a slight error in size thus caused inevitably brings about a great lowering of performance in the case of electronic materials, precision machine component parts and so forth used in high-frequency circuit component parts. Hence, such materials have had problems that not only any high working precision cannot be achieved but also electric and electronic properties tend to deteriorate.

More specifically, in such electronic materials or component parts, precision machine component parts and structural materials, not only a high working precision is required, but also, at the stage of production, the coefficient of thermal expansion must be controlled in accordance with use environment.

In addition, where materials free of any expansion and contraction in a high-temperature condition are demanded, there has been a problem that the composite material comprised of an epoxy resin and a negative thermal expansion material as reported by Sleight et al. can not substantially materialize such materials.

More specifically, in the field of precision machines in which the working precision is required in the order of microns, the above composite material can not cope with its use in a high-temperature condition. Accordingly, it is sought to provide structural materials and precision machine component parts making use of a material substantially free of any expansion and contraction over a wide temperature range.

SUMMARY OF THE INVENTION

An object of the present invention is to provide a material whose coefficient of thermal expansion is substantially zero over a wide temperature range (a zero thermal expansion material), and also to provide various materials and component parts making use of this materials and having good properties.

To achieve the above object, the present invention provides a zero thermal expansion material comprising a mixed material of a negative thermal expansion material and a positive thermal expansion material;

the negative thermal expansion material comprising a double oxide containing at least partly a compound represented by the chemical formula: $RQ_2O_8$ (wherein R is Zr, Hf or a tetravalent metallic element represented by a mixture system of these, and Q is a hexavalent metallic element selected from W and Mo); and the positive thermal expansion material comprising a material containing at least partly a compound represented by the chemical formula: $MQX_4$ (wherein M is Mg, Ca, Sr, Ba, Ra or a divalent metallic element represented by a mixture system of any of these, Q is a hexavalent metallic element selected from W and Mo, and X is an element selected from O and S).

The present invention also provides a zero thermal expansion material comprising a double oxide represented by the chemical formula: $(RM)(QO_4)_3$ (wherein R is Zr, Hf or a tetravalent metallic element represented by a mixture system of these, M is Mg, Ca, Sr, Da, Ra or a divalent metallic element represented by a mixture system of any of these, and Q is a hexavalent metallic element selected from W and Mo).

The present invention enables production of a zero thermal expansion material whose coefficient of thermal expansion is substantially zero. Since a ceramic material is used as the positive thermal expansion material, the coefficient of thermal expansion may little change even at a high temperature of 1,000° C. or more. This makes it possible to provide a zero thermal expansion material which is a heat-resistant material also having a high working precision.

The present invention still also provides a practical component part making use of any of these zero thermal expansion materials, which more specifically includes high-frequency circuit substrates, high-frequency circuit component parts, precision machine component parts and structural materials.

Thus, when high frequencies in the millimeter wave range are used where, e.g., a component part has a length corresponding to wavelength at most, it is possible to actually provide electronic materials having a high-precision workability and also having a substantially zero coefficient of thermal expansion, and high-performance electronic component parts which may undergo less variations in characteristics due to temperature. In the filed of precision machines for which working precision is required in the order of microns, it is possible to provide good structural material and precision machine component parts substantially free of any expansion and contraction over a wide temperature range.

DESCRIPTION OF THE PREFERRED EMBODIMENTS

Figure 1:
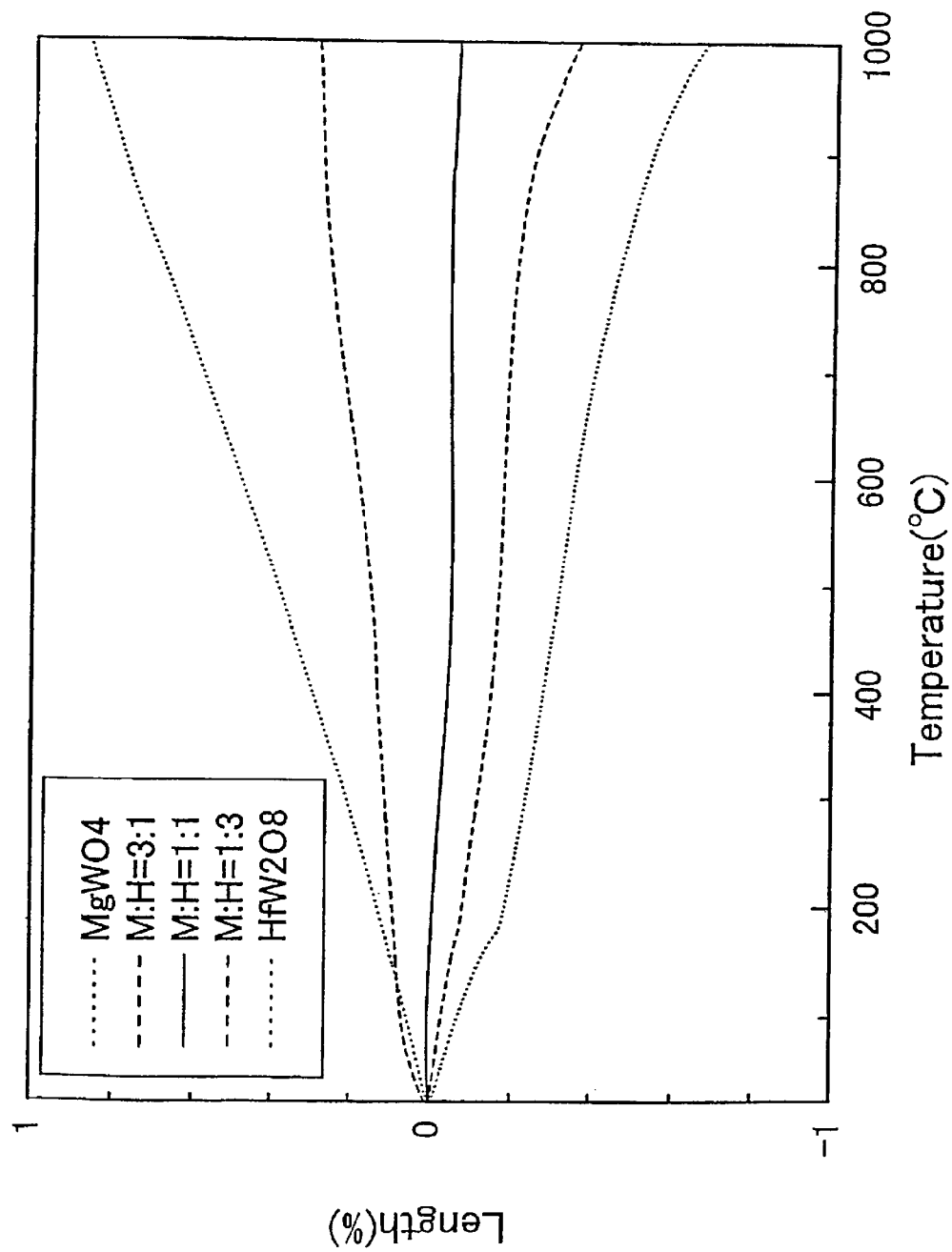
FIG. 1 is a graph of characteristics which shows coefficients of thermal expansion of materials according to an embodiment of the present invention.

In a first embodiment of the present invention, it is a zero thermal expansion material comprising a mixed material of a negative thermal expansion material and a positive thermal expansion material. The negative thermal expansion material comprises a double oxide containing at least partly a compound represented by the chemical formula: $RQ_2O_8$ (wherein R is Zr, Hf or a tetravalent metallic element represented by a mixture system of these, and Q is a hexavalent metallic element selected from W and Mo). The positive thermal expansion material comprises a material containing at least partly a compound represented by the chemical formula: $MQX_4$ (wherein M is Mg, Ca, Sr, Ba, Ra or a divalent metallic element represented by a mixture system of these, Q is a hexavalent metallic element selected from W and Mo, and X is an element selected from O and S). This material has the action to enable control of the coefficient of thermal expansion to substantially zero.

In a second embodiment of the present invention, it is a zero thermal expansion material comprising a double oxide represented by the chemical formula: $(RM)(QO_4)_3$ (wherein R is Zr, Hf or a tetravalent metallic element represented by a mixture system of these, M is Mg, Ca, Sr, Ba, Ra or a divalent metallic element represented by a mixture system of any of these, and Q is a hexavalent metallic element selected from w and Mo). This material has the action to enable control of the coefficient of thermal expansion by controlling its content.

In the zero thermal expansion material according to the second embodiment, it may preferably be a material in which R is Zr, Hf or a tetravalent metallic element containing these, M is Mg and Q is a hexavalent metallic element selected from W and Mo. It may more preferably be a zero thermal expansion material in which R is Hf, M is Mg and Q is W.

The present invention is also a high-frequency circuit substrate making use of any of the above zero thermal expansion materials, which has the action to make any shape change due to temperature less occur and to stabilize electrical properties in the millimeter wave range.

The present invention is still also a high-frequency circuit component part making use of any of the above zero thermal expansion materials, which has the action to make any shape change due to temperature less occur and to stabilize electrical properties in the millimeter wave range.

The present invention is further a precision machine component part making use of any of the above zero thermal expansion materials, which has the action to lessen any scattering in working precision due to temperature.

The present invention is still further a structural material making use of any of the above zero thermal expansion materials, which has the action to lessen any scattering in working precision due to temperature.

Embodiments of the present invention are described below with reference to FIGS. 1 to 3.

Embodiment 1

In this embodiment of the present invention, shown is a case in which a zero thermal expansion material is produced using a material containing the double oxide represented by the chemical formula: $(RM)(QO_4)_3$ (wherein R is Zr, Hf or a tetravalent metallic element represented by a mixture system of these, M is Mg, Ca, Sr, Ba, Ra or a divalent metallic element represented by a mixture system of these, and Q is a hexavalent metallic element selected from W and Mo). Materials used are a material A [A is a material having a crystal system of $RQ_2O_2$, and having a coefficient of thermal expansion which is negative (coefficient of thermal expansion: $\alpha(\alpha>0)$; density: a] and a material B [B is a material having a crystal system of $MQO_4$, and having a coefficient of thermal expansion which is positive (coefficient of thermal expansion: $\beta$; density: b]. Coefficients of thermal expansion of chief materials are shown in Table 1 below.

TABLE 1

| Materials | Dielectric constant (room temperature) | Coefficient of thermal expansion ($\times 10^6/°$ C.) |
|---|---|---|
| $HfW_2O_8$ | 15–20 | −5—−10 |
| $ZrW_2O_8$ |  | −8.3 |
| $SiO_2$ | 3.5–4.6 | +0.36 (quartz glass) |
| $Al_2O_3$ | 8.0–11.0 | +5–6.7 |
| MgO |  | +10.4 |
| $Al_6Si_2O_{13}$ |  | +5.4 |
| $MgAl_2O_4$ | 7.6–9.0 | +8.8 |
| $MgSiO_3$ | 6.0 | (positive) |
| $MgSiO_4$ | 6.4 | +10–11 |
| $Mg_2Al_4Si_5O_{18}$ |  | +16–63 |
| $MgWO_4$ | 18 | +5–8 |
| $HfSiO_4$ |  | (positive) |
| $ZrSiO_4$ |  | +3.7 |

The materials A and B may be mixed in a volume ratio A:B of $\beta:\alpha$, followed by firing to produce a material containing a double oxide having the crystal structure of $(RM)(QO_4)_3$, where the coefficient of thermal expansion comes to substantially zero.

Where the coefficient of thermal expansion and density of materials are evident, the materials may be so weighed and mixed that weights x and y of the materials A and B come to be x:y=aβ:bα (Equation 1), followed by firing to produce the material containing a double oxide having the crystal structure of $(RM)(QO_4)_3$, where the coefficient of thermal expansion comes to substantially zero.

Here, the double oxide having the crystal structure of $(R^{2+}M^{4+})(QO_4)_3$ has the same structure as the negative thermal expansion material $A^{3+}_2(QO_4)_3$ reported by Evans et al., and, as a result of its X-ray diffraction, this oxide is considered to be a double oxide having crystal structure wherein the site of $(A^{3+}_2)$ has been substituted with $(R^{2+}M^{4+})$. More specifically, the substitution of $(A^{3+}_2)$ with $(R^{2+}M^{4+})$ is considered to be indispensable to materialize low thermal expansion materials, Also, these materials are expressed as $(RO_2)(MO)(QO_3)_3$ in some cases.

With regard to the mixing ratio, since characteristic values (such as coefficient of thermal expansion and density) of the positive material and negative material may vary depending on pretreatment such as mixing and pulverization of materials, and on sintering conditions such as temperature of calcination, temperature of main-treatment firing, pressure and environment, care must be taken to mix them on the basis of characteristic values of materials just before their mixing.

As a specific example, a zero thermal expansion material containing $(HfMg)(WO_4)_3$, which is one of the double oxide $(RM)(QO_4)_3$ is described below in detail as an experimental report. This zero thermal expansion material may be produced using $HfW_2O_8$ and $MgWO_4$ as the material A and the material B, respectively.

As to the $HfW_2O_8$, $HfO_2$ (available from Kanto Kagaku K. K.; purity: 99.5%) and $WO_3$ (available from High Purity Chemicals Co., Ltd.; purity: 4N) were used as starting materials. These were so weighed that $HfO_2$ and $WO_3$ came to be in a molar ratio of 1:2, and then mixed and pulverized by means of a ball mill. The raw-material powder thus obtained was calcined at 1,150° C. to produce $HfW_2O_8$.

Similarly, as to the $MgWO_4$, too, MgO and $WO_3$ were weighed in a molar ratio of 1:2, and then mixed and pulverized by means of a ball mill. The raw-material powder thus obtained was thereafter calcined at 1,000° C. to produce $MGWO_4$.

The respective calcined powders were measured by X-ray diffraction to ascertain that the reaction had sufficiently proceeded.

Next, since the $HfW_2O_4$ had a coefficient of thermal expansion of −8 ppm/° C. and a theoretical density of 5.884 g/cm³ and the $MgWO_4$ had a coefficient of thermal expansion of +8 ppm/° C. and a theoretical density of 5.77 g/cm³, having the size of coefficient of thermal expansion and the density which were substantially equal to each other, the calcined powders of $Hfw_2O_8$ and $MgWO_4$ were so weighed as to be in a weight ratio of 1:1 (M:H=1:1), and then mixed and pulverized sufficiently by means of a ball mill, followed by extrusion into pellets. These pellets of the mixed powder were molded, followed by main-treatment firing at 1,150° C., and the coefficient of thermal expansion of the resultant molded product was measured. Results obtained are shown in FIG. 1. As shown in FIG. 1 by a solid line, it was able to obtain a zero thermal expansion material whose coefficient of thermal expansion was ±1×10⁻⁶/° C. or less in any temperature range of from room temperature to 1,000° C.

It was also able to synthesize a material having a coefficient of thermal expansion of −4 ppm/° C. when $HfW_2O_8$ and $MgWO_4$ were mixed in a ratio of 3:1 (M:H =1:3), and to synthesize a material having a coefficient of thermal expansion of +4 ppm/° C. when $HfW_2O_8$ and $MgWO_4$ were mixed in a ratio of 3:1 (M:H=3:1). These results are also shown in FIG. 1 by chain lines. The coefficients of thermal expansion when $HfW_2O_8$ and $MgWO_4$ were each used alone are also shown as references in FIG. 1 by doted lines.

Figure 2:
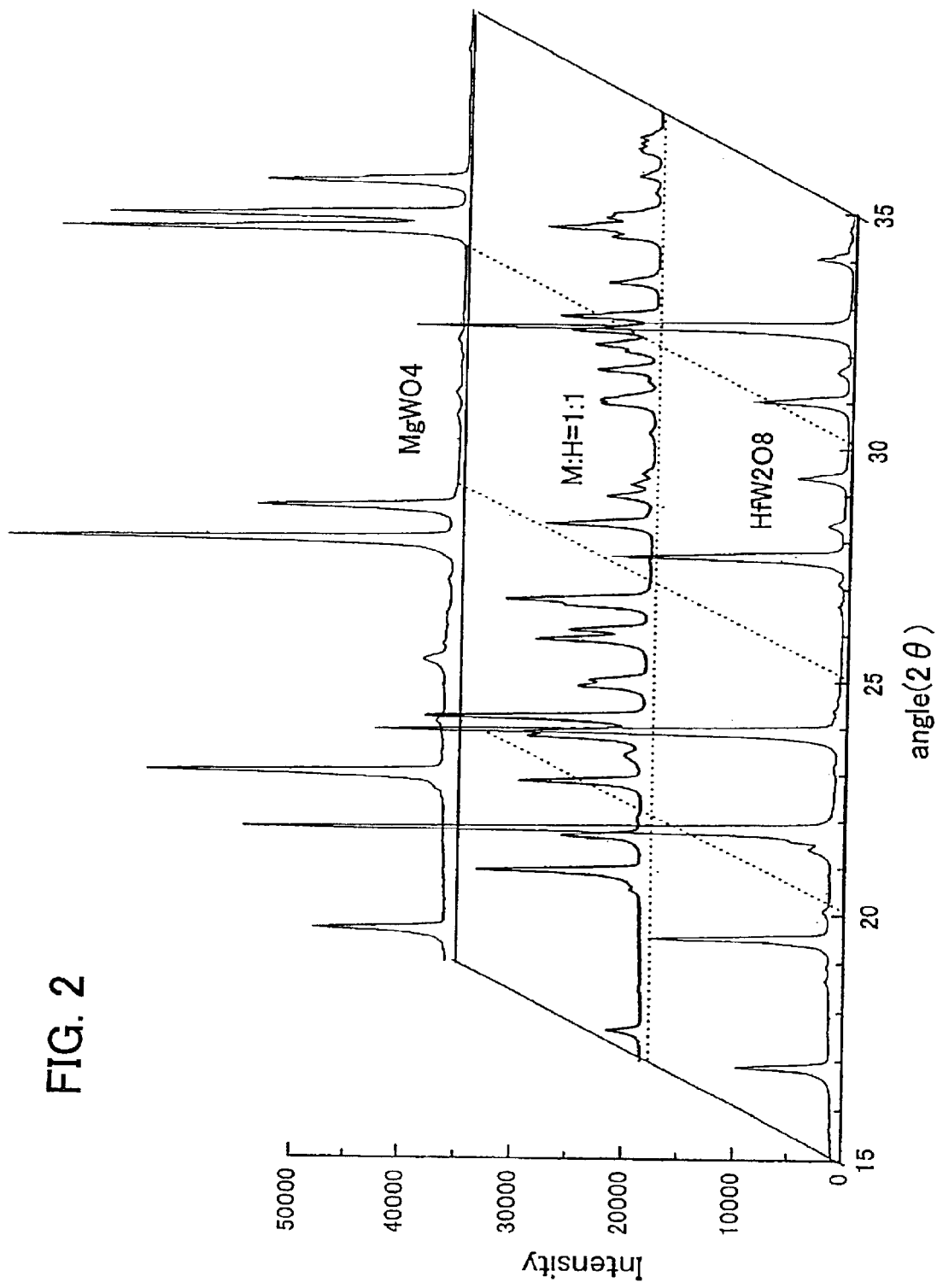
FIG. 2 is a graph of characteristics which shows X-ray diffraction patterns of materials according to an embodiment of the present invention.
Figure 3:
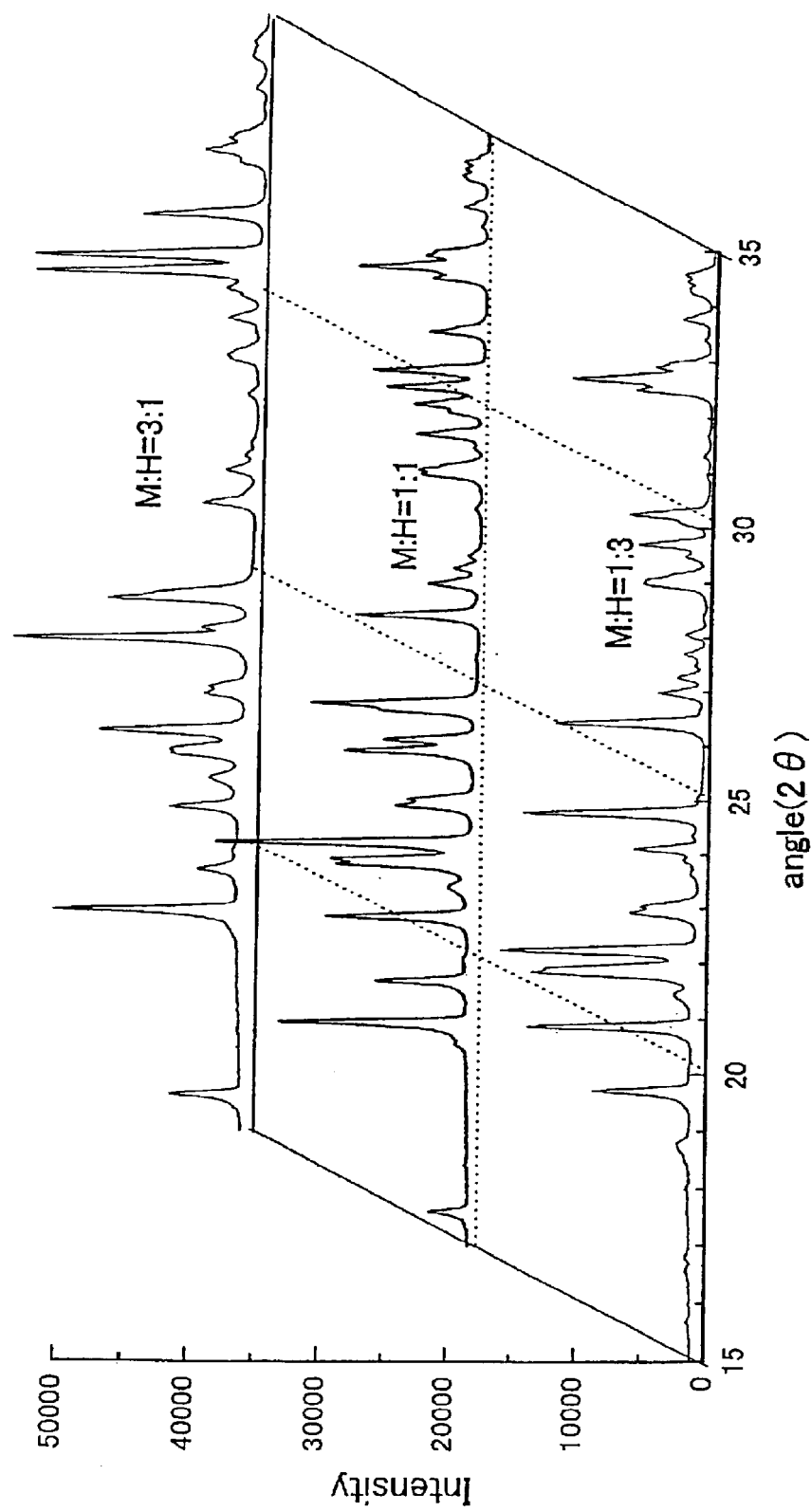
FIG. 3 is a graph of characteristics which shows X-ray diffraction patterns of materials according to an embodiment of the present invention.

The materials showing the coefficients of thermal expansion shown in FIG. 1 were analyzed by X-ray diffraction to obtain the results shown in FIGS. 2 and 3 as X-ray diffraction patterns.

FIG. 2 shows three X-ray diffraction patterns of the $HfW_2O_8$, the $MgWO_4$, and the material prepared by mixing these in 1:1. As can be seen therefrom, in the material of 1:1 mixture, $(HfMg)(WO_4)_3$ has been synthesized in addition to $HfW_2O_8$ and $MgWO_4$.

FIG. 3 shows three X-ray diffraction patterns of the material prepared by mixing $HfW_2O_8$ and $MgWO_4$ in 1:1, the material prepared by mixing these in 1:3 and the material prepared by mixing these in 3:1. As can be seen therefrom, in the materials of 1:3 and 3:1 mixture, too, $(HfMg)(WO_4)_3$ has been synthesized like the material of 1:1 mixture.

Thus, as can clearly be seen from FIGS. 2 and 3, in order to synthesize the zero thermal expansion material and control the coefficient of thermal expansion, it is indispensable for the material to contain the material having crystal structure such as the $(HfMg)(WO_4)_3$, i.e., the double oxide represented by the formula: $(RM)(QO_4)_3$.

As a different example, using $ZrW_2O$ or a mixture of $HfW_2O_8$ and $ZrW_2O_1$, a zero thermal expansion material was produced adding $MgWO_4$ thereto. In such a case, too, it was possible to obtain a zero thermal expansion material whose coefficient of thermal expansion was similarly±2× 10⁻⁶° C. or less in the temperature range of from room temperature to 1,000° C.

In the material of this example, synthesis of a materials of $(ZrMg)(WO_4)_3$ or $(Zr_xHf_{1+x}Mg)(WO_4)_3$ has been ascertained. Thus, as can also clearly be seen from this example, it is indispensable for the zero thermal expansion material of the present invention to contain the double oxide represented by the formula: $(RM)(QO_4)_3$.

Embodiment 2

Figure 4:
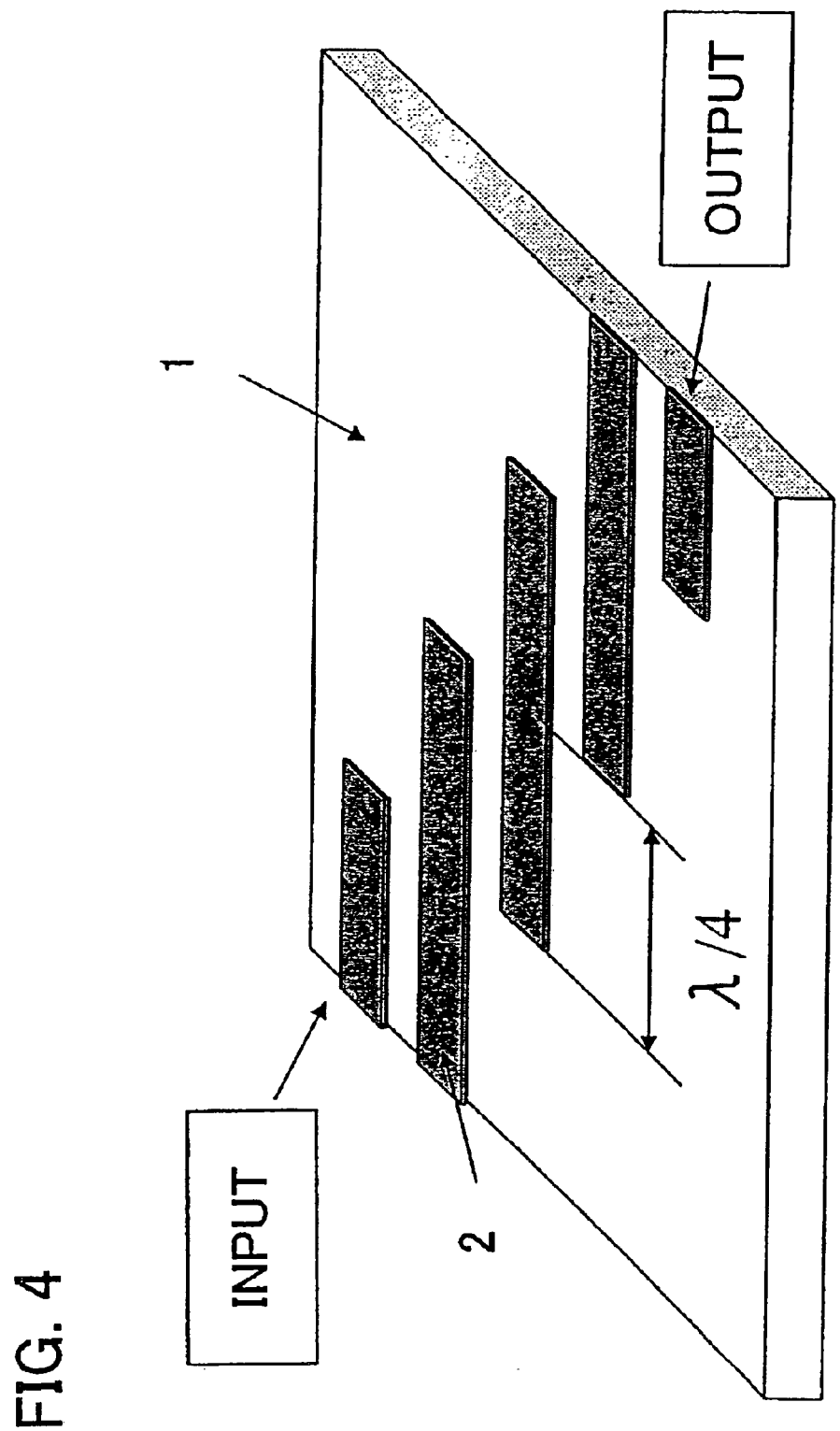
FIG. 4 is a perspective view showing a band-pass filter according to an embodiment of the present invention.

FIG. 4 is a perspective view showing a band-pass filter making use of the zero thermal expansion material, according to this Embodiment.

To the outset, using the calcined powders of $HfW_2O_8$ and $MgWO_4$ weighed in a weight ratio of 1:1 as used in Embodiment 1, these were mixed together with a binder resin by means of a ball mill, and a green sheet was obtained from the resultant mixture by a doctor blade method. Then, the green sheet thus obtained was cut in a desired size, and twenty cut sheets were so piled up as to be 1 mm in plate thickness after firing, followed by compression molding. The molded product obtained was fired at 1,150° C. to obtain a platelike sintered body for a high-frequency circuit substrate. The coefficient of thermal expansion of this plate was measured to find that it was +0.8 ppm/° C. Needless to say, the plate produced here contained the material of $(HfMg)(WO_4)_3$.

Next, as shown in FIG. 4, this platelike sintered body was used as a dielectric substrate 1 of a high-frequency circuit substrate. On this substrate, strip lines were formed using metal conductors 2 to make up a band-pass filter.

Filter characteristics at room temperature up to 100° C. were measured. As the result, since the substrate had a small coefficient of thermal expansion, a filter with stable frequency characteristics was obtainable.

As described above, substrates and component parts having good characteristics can be obtained by producing substrates for high-frequency circuits and component parts for high-frequency circuits, using the zero thermal expansion material having a small coefficient of thermal expansion.

In the case when the $HfW_2O_8$ and $MgWO_4$ are thus used, the weight ratio of these may be changed to control the content of $(HfMg)(WO_4)_3$. Such control makes it easy to control the coefficient of thermal expansion arbitrarily between −8 ppm/° C. and +8 ppm/° C. over a wide temperature range of from room temperature to 1,000° C. Also, use of different materials enables change of the range of control of the coefficient of thermal expansion to any desired range.

Thus, where the precision in the order of microns is required in relation to surrounding members, as in the case of precision machine component parts and structural materials, the present invention is effective of course when the coefficient of thermal expansion is zero and also when the coefficient of thermal expansion should be controlled.

As described above, according to the present invention, a superior zero thermal expansion material whose coefficient of thermal expansion is substantially zero can be provided. Also, the use of this material brings about an advantageous effect that high-precision and high-performance practical component parts such as high-frequency circuit substrates and high-frequency circuit component parts, precision machine component parts and structural materials can be provided.

What is claimed is:

1. A process for producing a zero thermal expansion material; the process comprising mixing a negative thermal expansion material and a positive thermal expansion material, followed by firing;

said negative thermal expansion material comprising a double oxide containing at least partly a compound represented by the chemical formula:

$$RQ_2O_8$$

wherein R is Zr, Hf or a tetravalent metallic element represented by a mixture system of these, and Q is a hexavalent metallic element selected from W and Mo; and said positive thermal expansion material comprising a material containing at least partly a compound represented by the chemical formula:

$$MQX_4$$

wherein M is Mg, Ca, Sr, Ba, Ra or a divalent metallic element represented by a mixture system of any of these, Q is a hexavalent metallic element selected from W and Mo, and X is an element selected from O and S.

2. The process for producing a zero thermal expansion material according to claim 1, wherein said R is Zr, Hf or a tetravalent metallic element containing these, said M being Mg.

3. The process for producing a zero thermal expansion material according to claim 1, wherein said R is Hf, M is Mg and Q Is W.

4. The process for producing a zero thermal expansion material according to claim 1, wherein a weight ratio of $RQ_2O_8$ and $MOX_4$ is about 1:1.

* * * * *

UNITED STATES PATENT AND TRADEMARK OFFICE
CERTIFICATE OF CORRECTION

PATENT NO. : 6,844,283 B2
DATED : January 18, 2005
INVENTOR(S) : Tomoko Suzuki, Atsushi Omote and Jun Kuwata It is certified that error appears in the above-identified patent and that said Letters Patent is hereby corrected as shown below:

Title page,
Item [57], ABSTRACT,
Line 3, change "RQ,O," to -- $RQ_2O_8$ --;
Line 8, change "MQX," to -- $MQX_4$ --.

Column 8,
Line 30, change "Q Is W" to -- Q is W --;
Line 33, change "$MOX_4$" to -- $MQX_4$ --.

Signed and Sealed this

Tenth Day of January, 2006

JON W. DUDAS
*Director of the United States Patent and Trademark Office*